United States Patent [19]

Curtin

[11] Patent Number: 5,282,416
[45] Date of Patent: Feb. 1, 1994

[54] VERSATILE TILE-SLIDE SQUEEGEE DRIVE APPARATUS

[75] Inventor: Mark Curtin, Chelmsford, Mass.

[73] Assignee: Transition Automation, Inc., Chelmsford, Mass.

[21] Appl. No.: 991,575

[22] Filed: Dec. 16, 1992

[51] Int. Cl.⁵ ............................................. B05C 17/04
[52] U.S. Cl. ...................................... 101/123; 101/126
[58] Field of Search ................ 101/123, 124, 126, 129

[56] References Cited

U.S. PATENT DOCUMENTS 3,955,501  5/1976  Bubley et al. .................. 101/123
4,404,903  9/1983  Cronin ............................ 101/123

FOREIGN PATENT DOCUMENTS 0193367 11/1982 Japan .................................... 101/123

Primary Examiner—Edgar S. Burr
Assistant Examiner—Ren Yan
Attorney, Agent, or Firm—Samuels, Gauthier & Stevens

[57] ABSTRACT

A squeegee drive structure for a solder paste printing machine. The circuit board and screen are aligned in the machine. The squeegee drive structure is mounted on the machine independently of the screen to which the paste is applied. The drive structure which supports the squeegee is adapted for linear movement away from the solder paste application area and upward pivotal movement in order to provide easy access to the squeegee.

1 Claim, 3 Drawing Sheets

VERSATILE TILE-SLIDE SQUEEGEE DRIVE APPARATUS

BACKGROUND AND BRIEF SUMMARY OF THE INVENTION

The invention relates to an automatic or semi-automatic solder paste printing machine.

Solder paste printing machines typically comprise a pivoting (clam shell motion) head assembly which carries a separate structure for squeegee motion and guidance. The weight of the head assembly is quite high and the access to the loading area for securing the board and the stencil and introducing solder paste is limited. A top view of the board and stencil when the head assembly is down is not possible without the squeegee structure also down. Direct full board/stencil viewing is obscured by the squeegee structure. Further, access to the tooling area is limited, squeegees cannot be removed easily and the prior art machines are not readily 'scaleable'.

The tilt-slide squeegee drive structure of the invention is superior to prior art designs because it moves out from and clear of the service area of the printing system. Other systems open only to a limited degree. The tilt-slide combination allows the operator direct down viewing of critical stencil to board alignment which is not possible on existing designs.

The invention provides for a tilt-slide squeegee drive head which provides for simple stencil alignment, better in process control, such as checking stencil alignment and solder paste quantity and print performance. The invention allows exceptional access to the stencil loading area and simplifies paste replenishing, stencil changes and squeegee cleaning with minimal effort.

The quick release squeegees further enhances the structures ease of use by allowing quick changes of squeegees. Prior apparatus have larger, heavier means for removal, not suited for quick change. Instead of relying on intermediate hardware, the structure of the invention embodies a method of securing squeegees directly to the driving mechanism.

The invention provides a powdered squeegee drive integrated with a tilting and sliding structure which greatly improves the accessibility and ease of setup for solder paste printing machines. An aspect of the invention is guide rails which serve the dual function of guiding and sliding the squeegee head. The hardware is controlled away from service areas.

The tilt-slide design and two parallel rods define the length of the squeegee structure. All the hardware attaches to these rods. Therefore, this tilt-slide head can accommodate varying printer sizes by a simple change in the length of the rods and length of the drive belt.

DESCRIPTION OF THE PREFERRED EMBODIMENTS

Figure 1:
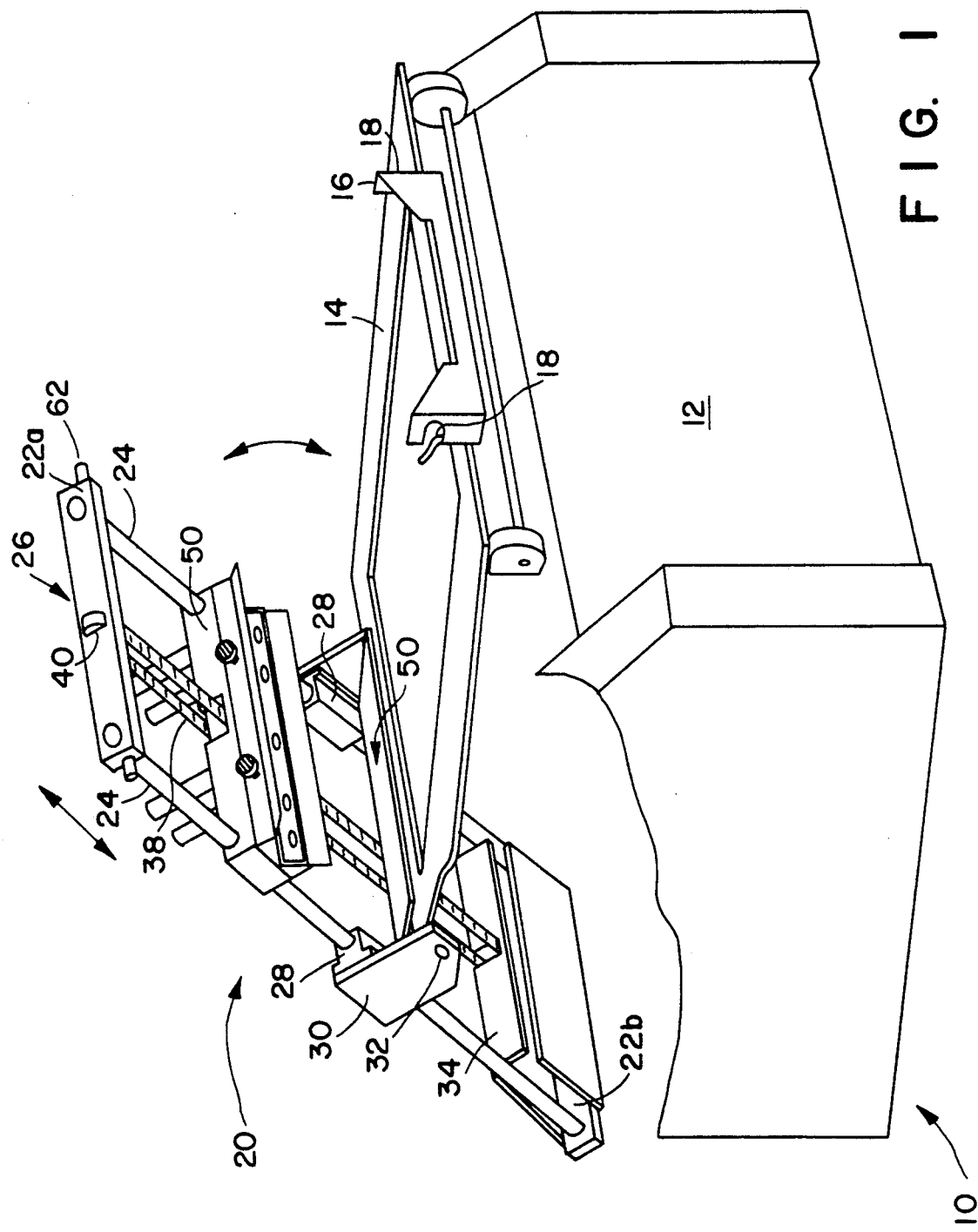
FIG. 1 is a perspective view of a machine embodying the invention.

Referring to FIG. 1, a solder paste printing machine is shown at 10 and comprises a printing stand 12 and printer top frame 14. The printer top frame 14 collectively represents a prior art SMT board, registered stencil and X, Y, Θ registration system which per se do not form part of the invention.

The top frame 14 has a front block 16, characterized by recesses 18.

The tilt-slide squeegee drive head of the invention is shown generally at 20. Endblocks 22a and 22b connect parallel rods 24 to create a rigid tilt-slide rectangular shaped structure 26.

A rear block 30 is pivotally secured at 32 to an attach block 50. The attach block 50 functions as a clamp, connecting the attach block 50 to the top frame 14. The rear block 30 includes slide bearings 28 in which are received the rods 24. This enables pivotal and linear motion of the structure 26 with respect to the top frame 14. This linear motion allows natural balancing forces to aid in the operation of lifting and opening structure 26 as shown in FIG. 3. This eliminates the need for powered lift devices.

A drive box 34 is secured to the endblock 22b which box 34 contains a motor and sprocket (not shown) which transmits torque to an endless drive belt 38. An idle sprocket 40 is rotatably pinned in the front block 22a and engages the drive belt 38.

The drive belt 38 is connected to and drives a squeegee assembly 50.

Figure 2:
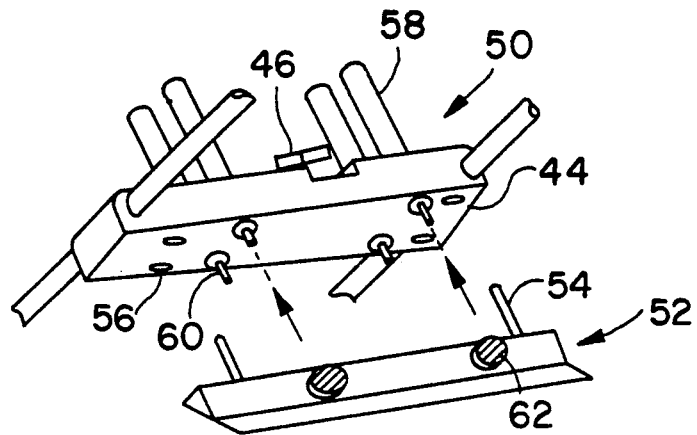
FIG. 2 is an enlarged perspective view of a release mechanism of FIG. 1.

The squeegee assembly, referring to FIG. 2, comprises a slidable mounting head 44 secured to the lower length of the endless drive belt 38 by a plate 46. Squeegees 52 have locator pins 54 which are received in mating alignment holes 56 in the head 44. Air cylinders terminate at their lower ends in pins 60. Set screws 62 engage the pins 60 to secure the squeegee.

When the tilt-slide head is pivoted down to commence printing, latch pins 64 engage the recesses 18 in the front block 16 to latch and lock this tilt-slide head into place.

FIG. 3 shows the range of positions of the tilt-slide head.

Figure 3A:
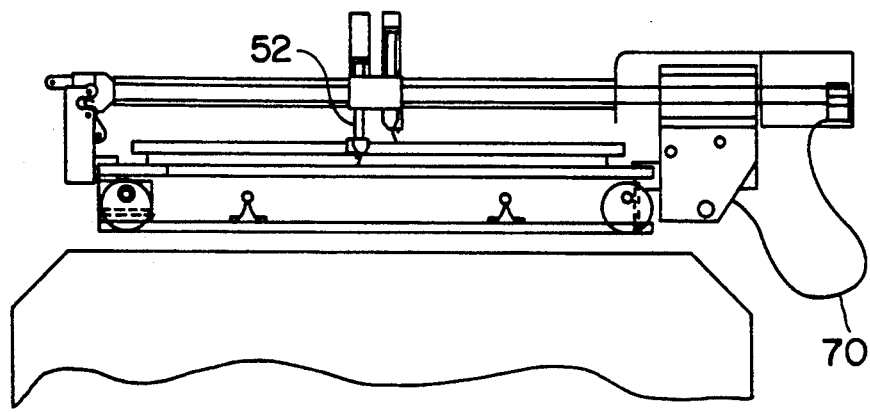
FIGS. 3a, 3b and 3c are side illustrations of movements of the tilt-slide squeegee drive head.

Referring to FIG. 3a, the tilt-slide head 20 is shown in its closed position with the squeegee 52 extended to engage the surface of a stencil. The latch pins 64 are latched in the recesses 18 of the block 16 to prevent displacement of the structure 26 during operation. The drive motor (not shown) is actuated to effect movement of the squeegee. The movement of the squeegee, its actuation, the distance it travels and deactuation are well within the skill of the art and need not be described in detail.

Figure 3B:
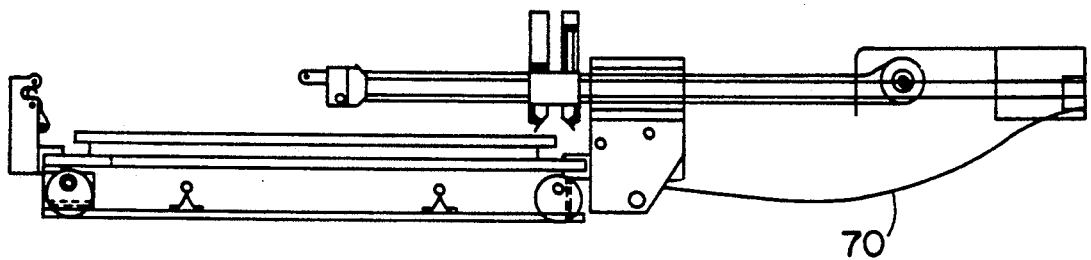
Figure 3C:
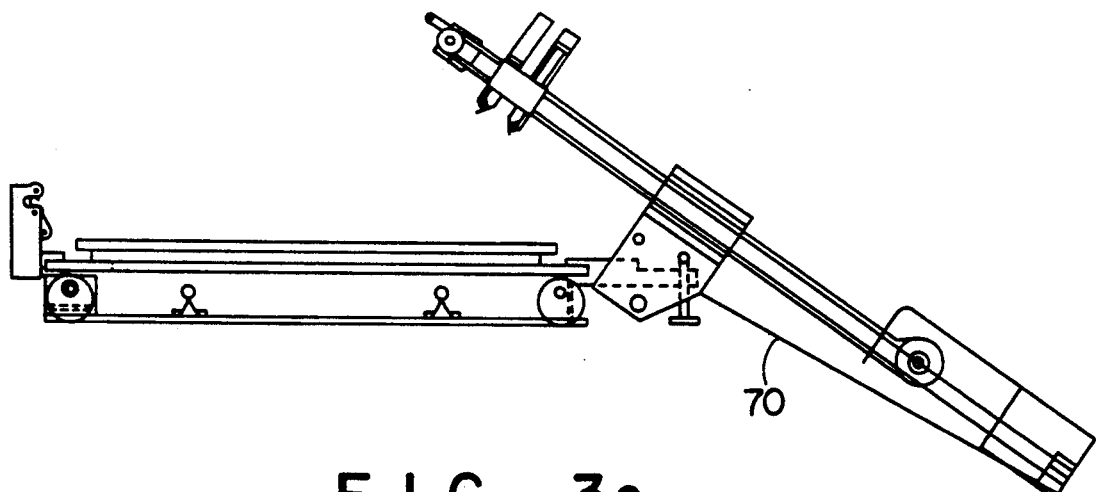

Referring to FIG. 3b, the structure 26 is displaced linearly with the structure 26 sliding along the rods 24. This lateral movement is limited by the limit strap 70.

To remove the stencil and the board, the structure 26 is then tilted upwardly with reference to the top frame 14. This allows easy access to the surface area to remove the board and stencil and to insert and align the next board stencil arrangement.

The foregoing description has been limited to a specific embodiment of the invention. It will be apparent, however, that variations and modifications can be made to the invention, with the attainment of some or all of the advantages of the invention. Therefore, it is the object of the appended claims to cover all such variations and modifications as come within the true spirit and scope of the invention.

Having described my invention, what I now claim is:

1. A solder paste apparatus having a stand and an upper frame adapted to support a board and a stencil, the board and stencil adapted for relative movement in X, Y and Θ directions, the stencil in registration with the board, the improvement which comprises:
- a structure having a pair of guide rods in spaced apart parallel relationship, forward and rearward blocks joined to the rods to maintain the guide rods in fixed spaced apart relationship;
- means to secure the structure to the frame for pivotal and linear motion;
- a squeegee assembly mounted for travel in reciprocating motion on the rods;
- means to drive the squeegee in its reciprocal path, the squeegee adapted to move in translation with reference to the surface of the stencil;
- means to move the structure in a linear direction along an axis parallel to the guide rods away from the stencil; and
- means to pivot the structure away from the stencil about an axis transverse to the axis along which structure travels.

* * * * *